United States Patent
Han et al.

(10) Patent No.: US 10,804,320 B2
(45) Date of Patent: Oct. 13, 2020

(54) INSULATION LAYER ARRANGEMENT FOR MAGNETIC TUNNEL JUNCTION DEVICE

(71) Applicant: SAMSUNG ELECTRONICS CO., LTD., Suwon-si (KR)

(72) Inventors: Yoonsung Han, Seoul (KR); Seung Pil Ko, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 15/791,503

(22) Filed: Oct. 24, 2017

(65) Prior Publication Data

US 2018/0350875 A1  Dec. 6, 2018

(30) Foreign Application Priority Data

Jun. 5, 2017  (KR) .......................... 10-2017-0069777

(51) Int. Cl.

| | |
|---|---|
| *H01L 27/22* | (2006.01) |
| *H01L 43/10* | (2006.01) |
| *H01L 43/02* | (2006.01) |
| *H01L 23/532* | (2006.01) |
| *G11C 11/16* | (2006.01) |
| *H01L 43/12* | (2006.01) |

(52) U.S. Cl.
CPC ...... *H01L 27/228* (2013.01); *H01L 23/53295* (2013.01); *H01L 27/224* (2013.01); *H01L 43/02* (2013.01); *H01L 43/10* (2013.01); *G11C 11/161* (2013.01); *H01L 43/12* (2013.01)

(58) Field of Classification Search
CPC .......... G11C 2211/5615; G11C 11/161; H01L 27/224; H01L 23/5329; H01L 23/53295; H01L 21/76801–76837
See application file for complete search history.

(56) References Cited

U.S. PATENT DOCUMENTS

| | | | |
|---|---|---|---|
| 6,475,857 B1 | 11/2002 | Kim et al. | |
| 9,041,146 B2 | 5/2015 | Lee et al. | |
| 9,203,013 B2 | 12/2015 | Li et al. | |
| 9,543,357 B2 | 1/2017 | Ko et al. | |
| 9,548,333 B2 | 1/2017 | Lu et al. | |
| 9,595,561 B2 | 3/2017 | Lee | |
| 9,660,181 B2 | 5/2017 | Lee et al. | |
| 2005/0258463 A1* | 11/2005 | Yaegashi ............... | H01L 27/115 257/296 |
| 2013/0235656 A1 | 9/2013 | Li et al. | |
| 2014/0042508 A1 | 2/2014 | Lee | |

(Continued)

FOREIGN PATENT DOCUMENTS

KR  10-2003-0097881 A  12/2003

*Primary Examiner* — Thao X Le
*Assistant Examiner* — Gardner W. S. Swan
(74) *Attorney, Agent, or Firm* — Sughrue Mion, PLLC

(57) ABSTRACT

Disclosed are a semiconductor device and a method of manufacturing the same. The semiconductor device comprises a substrate including a cell region and a peripheral region, a magnetic tunnel junction pattern on the cell region, a capping insulation layer covering a sidewall of the magnetic tunnel junction pattern, and an upper insulation layer including a first portion on the capping insulation layer and a second portion on the peripheral region. A level of a bottom surface of the second portion is lower than that of a bottom surface of the capping insulation layer.

18 Claims, 15 Drawing Sheets

(56) References Cited

U.S. PATENT DOCUMENTS

| | | |
|---|---|---|
| 2014/0264668 A1 | 9/2014 | Lee et al. |
| 2014/0264679 A1 | 9/2014 | Lee et al. |
| 2015/0014800 A1* | 1/2015 | Satoh .................. H01L 43/02 257/421 |
| 2016/0020249 A1 | 1/2016 | Ko et al. |
| 2016/0072050 A1* | 3/2016 | Yoshikawa ............ H01L 43/08 257/421 |
| 2016/0093668 A1 | 3/2016 | Lu et al. |
| 2016/0254445 A1 | 9/2016 | Tahmasebi et al. |
| 2017/0148849 A1* | 5/2017 | Chuang ................ H01L 27/228 |
| 2017/0222128 A1* | 8/2017 | Sung .................... H01L 43/12 |
| 2017/0345869 A1* | 11/2017 | Park .................... H01L 27/222 |

\* cited by examiner

INSULATION LAYER ARRANGEMENT FOR MAGNETIC TUNNEL JUNCTION DEVICE

CROSS-REFERENCE TO THE RELATED APPLICATION

This application claims priority under 35 U.S.C. § 119 to Korean Patent Application No. 10-2017-0069777 filed on Jun. 5, 2017, the contents of which are herein incorporated by reference in their entirety.

BACKGROUND

1. Technical Field

The present inventive concept relates to a semiconductor device, and more particularly, to a semiconductor device including a magnetic memory device and a method of fabricating the same.

2. Related Art

A magnetic memory device is a memory device utilizing a magnetic tunnel junction (MTJ). The magnetic tunnel junction may include two magnetic layers and an insulation layer interposed therebetween, and a resistance of the magnetic tunnel junction may vary depending on magnetization directions of the two magnetic layers. The magnetic tunnel junction may have a relatively high resistance when the magnetization directions of the two magnetic layers are anti-parallel to each other and a relatively low resistance when the magnetization directions of the two magnetic layers are parallel to each other. The magnetic memory device may write/read data using the resistance difference of the magnetic tunnel junction.

SUMMARY

According to exemplary embodiments of the present inventive concept, a semiconductor device may comprise: a substrate including a cell region and a peripheral region, a magnetic tunnel junction pattern on the cell region, a capping insulation layer covering a sidewall of the magnetic tunnel junction pattern, and an upper insulation layer including a first portion on the capping insulation layer and a second portion on the peripheral region. A level of a bottom surface of the second portion may be lower than that of a bottom surface of the capping insulation layer.

According to exemplary embodiments of the present inventive concept, a semiconductor device may comprise, a substrate including a cell region and a peripheral region, a pair of magnetic tunnel junction patterns on the cell region, a pair of conductive mask patterns respectively on the pair of magnetic tunnel junction patterns, a capping insulation layer between the pair of magnetic tunnel junction patterns, and an upper insulation layer including a first portion on the capping insulation layer. A level of a top surface of the capping insulation layer may be between those of top and bottom surfaces of each of the pair of conductive mask patterns.

According to exemplary embodiments of the present inventive concept, a method of manufacturing a semiconductor device may comprise providing a substrate including a cell region and a peripheral region, forming a lower insulation layer on the substrate, the lower insulation layer including a first portion on the cell region and a second region on the peripheral region, forming magnetic tunnel junction patterns on the first portion of the lower insulation layer, forming a capping insulation layer covering the magnetic tunnel junction patterns, the capping insulation layer including a first portion on the cell region and a second portion on the peripheral region, and performing an etch-back process to remove the second portion of the capping insulation layer, wherein the second portion of the lower insulation layer is exposed by the etch-back process.

DETAILED DESCRIPTION OF THE EXEMPLARY EMBODIMENTS

Figure 1:
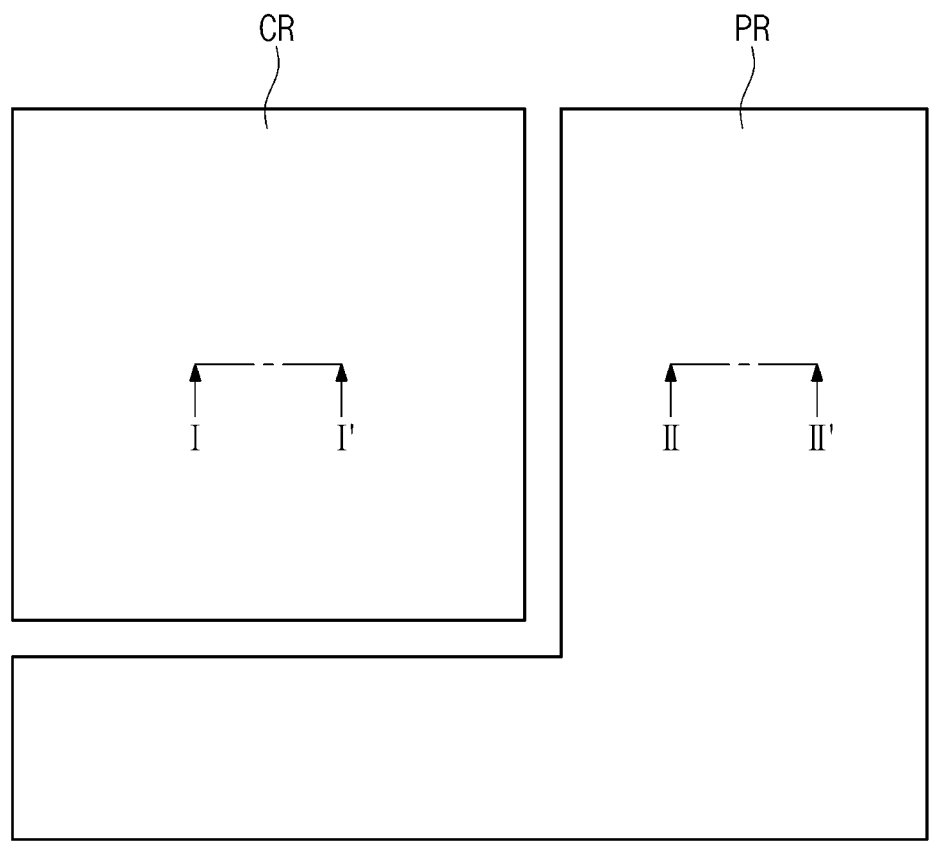
FIG. 1 illustrates a plan view of a semiconductor device according to exemplary embodiments of the present inventive concept.

It will be described herein exemplary embodiments of the present inventive concept with reference to the accompanying drawings. Like reference numerals may indicate like components throughout the description.

Figure 2:
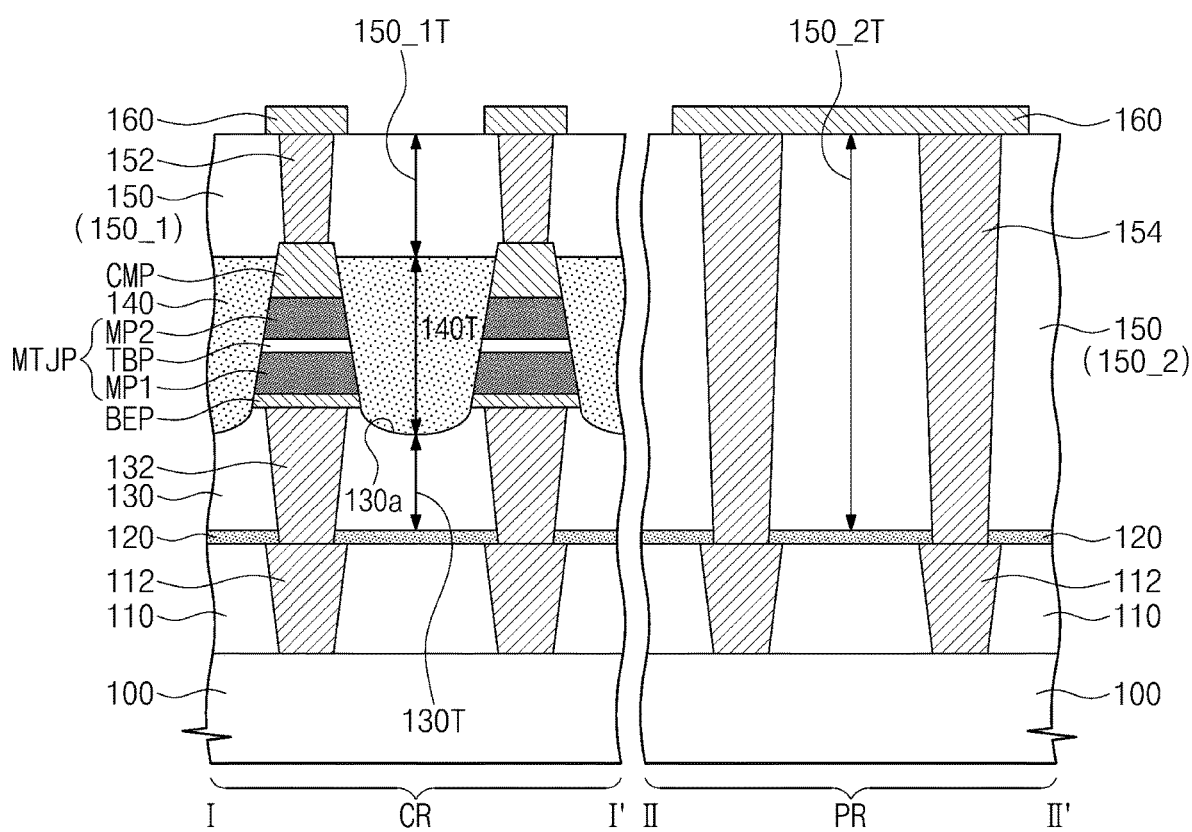
FIG. 2 illustrates a cross-sectional view of a semiconductor device according to exemplary embodiments of the present inventive concept.

FIG. 1 illustrates a plan view of a semiconductor device according to exemplary embodiments of the present inventive concept. FIG. 2 illustrates a cross-sectional view of a semiconductor device according to exemplary embodiments of the present inventive concept. FIG. 2 is a cross-sectional view taken along lines I-I' and II-II' of FIG. 1.

Referring to FIGS. 1 and 2, a substrate 100 may be provided. In an embodiment, the substrate 100 may include a cell region CR and a peripheral region PR. The cell region CR may correspond to a zone where magnetic tunnel junction patterns MTJP are provided, and the peripheral region PR may correspond to a zone where logic circuits are provided. The magnetic tunnel junction patterns MTJP may not be provided on the peripheral region PR according to an embodiment. The cell and peripheral regions CR and PR may be adjacent to each other, and their planar arrangement may not be limited to those shown in figures.

The substrate 100 may include a semiconductor substrate. For example, the substrate 100 may include a silicon substrate, a germanium substrate, or a silicon-germanium substrate. The substrate 100 may be provided thereon with select elements and/or the logic circuits. For example, the select elements may be provided on the cell region CR, and the logic circuits may be provided on the peripheral region PR. The select elements and the logic circuits may be transistors or diodes.

A first lower insulation layer 110 may be provided on the substrate 100. For example, the first lower insulation layer 110 may be provided on the cell and peripheral regions CR and PR. The first lower insulation layer 110 may cover the select elements and the logic circuits. The first lower insulation layer 110 may include an insulating material. For example, the first lower insulation layer 110 may include one or more of silicon oxide, silicon nitride, and silicon oxynitride.

Lower lines 112 may be provided in the first lower insulation layer 110. The lower lines 112 may be electrically connected to the select elements and the logic circuits. The lower lines 112 may include a conductive material. For example, the lower lines 112 may include one or more of doped semiconductor (e.g., doped silicon or doped germanium), metal (e.g., tungsten or copper), conductive metal nitride (e.g., titanium nitride, tantalum nitride, or tungsten nitride), and metal-semiconductor compound (e.g., metal silicide).

An etch stop layer 120 may be provided on the first lower insulation layer 110. For example, the etch stop layer 120 may be provided on the cell and peripheral regions CR and PR. The etch stop layer 120 may cover the first lower insulation layer 110 and the lower lines 112. The etch stop layer 120 may include an insulating material exhibiting an etch selectivity to a second lower insulation layer 130. For example, the etch stop layer 120 may include silicon carbon nitride.

A second lower insulation layer 130 may be provided on the etch stop layer 120. For example, the second lower insulation layer 130 may be provided on the cell region CR but not on the peripheral region PR. The second lower insulation layer 130 may include an insulating material. For example, the second lower insulation layer 130 may include one or more of silicon oxide, silicon nitride, and silicon oxynitride.

Bottom contacts 132 may be provided in the second lower insulation layer 130. For example, the bottom contacts 132 may be provided on the cell region CR but not on the peripheral region PR. The bottom contacts 132 may penetrate the second lower insulation layer 130 and the etch stop layer 120 and be electrically connected to the lower lines 112. The bottom contacts 132 may include a conductive material. For example, the bottom contacts 132 may include one or more of doped semiconductor, metal, conductive metal nitride, and metal-semiconductor compound.

Magnetic tunnel junction patterns MTJP may be provided on the second lower insulation layer 130. For example, the magnetic tunnel junction patterns MTJP may be provided on the cell region CR but not on the peripheral region PR. The magnetic tunnel junction patterns MTJP may be electrically connected to the bottom contacts 132. The magnetic tunnel junction patterns MTJP may be spaced apart from each other in a direction parallel to a top surface of the substrate 100.

Each of the magnetic tunnel junction patterns MTJP may include a first magnetic pattern MP1, a tunnel barrier pattern TBP, and a second magnetic pattern MP2 that are sequentially stacked. One of the first and second magnetic patterns MP1 and MP2 may correspond to a reference magnetic pattern having a unidirectionally fixed magnetization direction, and the other of the first and second magnetic patterns MP1 and MP2 may correspond to a free magnetic pattern having a magnetization direction that can be changed parallel to or anti-parallel to the magnetization direction of the reference magnetic pattern. Each of the magnetic tunnel junction patterns MTJP and its corresponding bottom contact 132 may be provided therebetween with a bottom electrode pattern BEP. The bottom electrode pattern BEP may include, for example, conductive metal nitride such as titanium nitride and/or tantalum nitride. In some embodiments, the bottom electrode pattern BEP may not be provided.

A conductive mask pattern CMP may be provided on each of the magnetic tunnel junction patterns MTJP. The conductive mask pattern CMP may include, for example, tungsten, tantalum, aluminum, copper, titanium, and/or conductive metal nitride thereof. The conductive mask pattern CMP may be aligned with its underlying sidewalls of the magnetic tunnel junction pattern MTJP.

The second lower insulation layer 130 may have a top surface including concave portions 130a that are concavely recessed toward the substrate 100 between the magnetic tunnel junction patterns MTJP.

A capping insulation layer 140 may be provided on the second lower insulation layer 130. For example, the capping insulation layer 140 may be provided on the cell region CR but not on the peripheral region PR. The capping insulation layer 140 may include an insulating material. For example, the capping insulation layer 140 may include one or more of silicon oxide, silicon nitride, and silicon oxynitride.

The capping insulation layer 140 may cover sidewalls of the magnetic tunnel junction patterns MTJP. The capping insulation layer 140 may fill gaps between the magnetic tunnel junction patterns MTJP. The capping insulation layer 140 may also fill the concave portions 130a of the top surface of the second lower insulation layer 130. The capping insulation layer 140 may have a thickness 140T greater than that of each of the magnetic tunnel junction patterns MTJP.

The capping insulation layer 140 may have a bottom surface that protrudes toward the substrate 100 between the magnetic tunnel junction patterns MTJP. The bottom surface of the capping insulation layer 140 may be lower than bottom surfaces of the magnetic tunnel junction patterns MTJP.

Figure 3A:
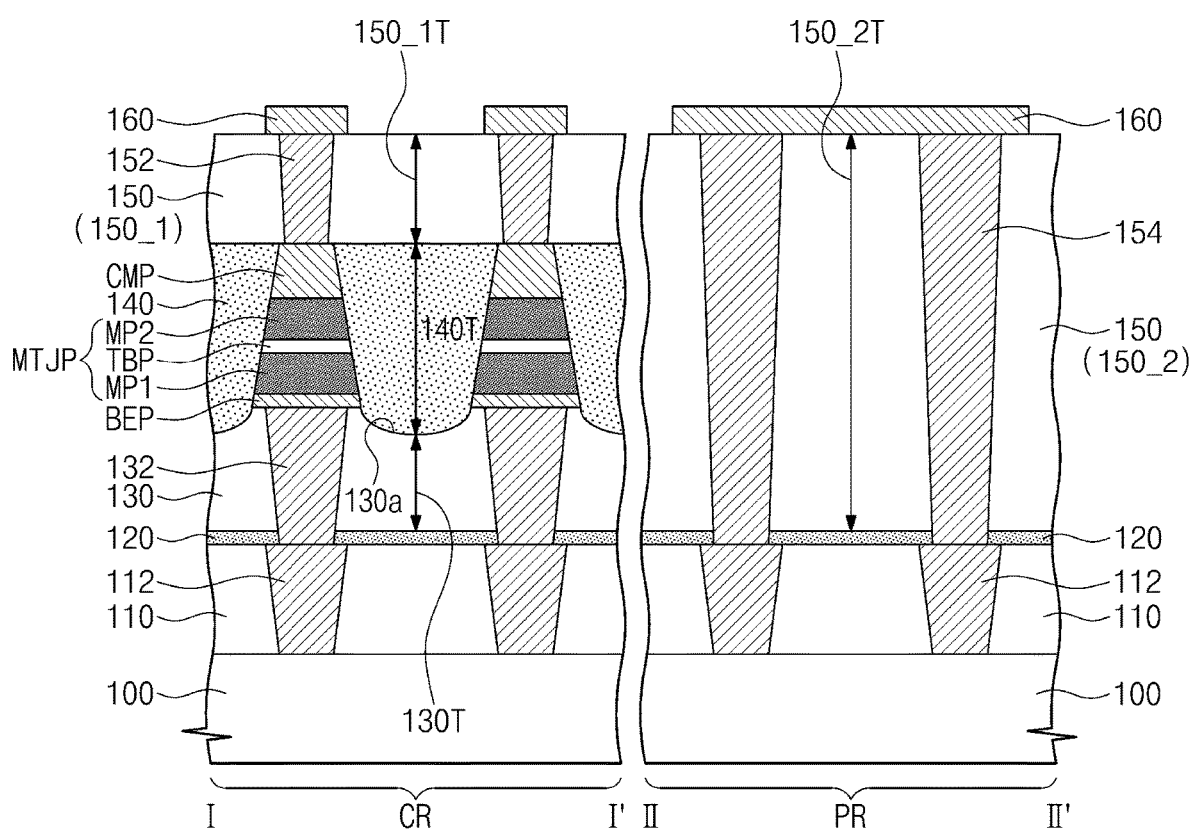
FIGS. 3A and 3B illustrate cross-sectional views of a semiconductor device according to exemplary embodiments of the present inventive concept.
Figure 3B:
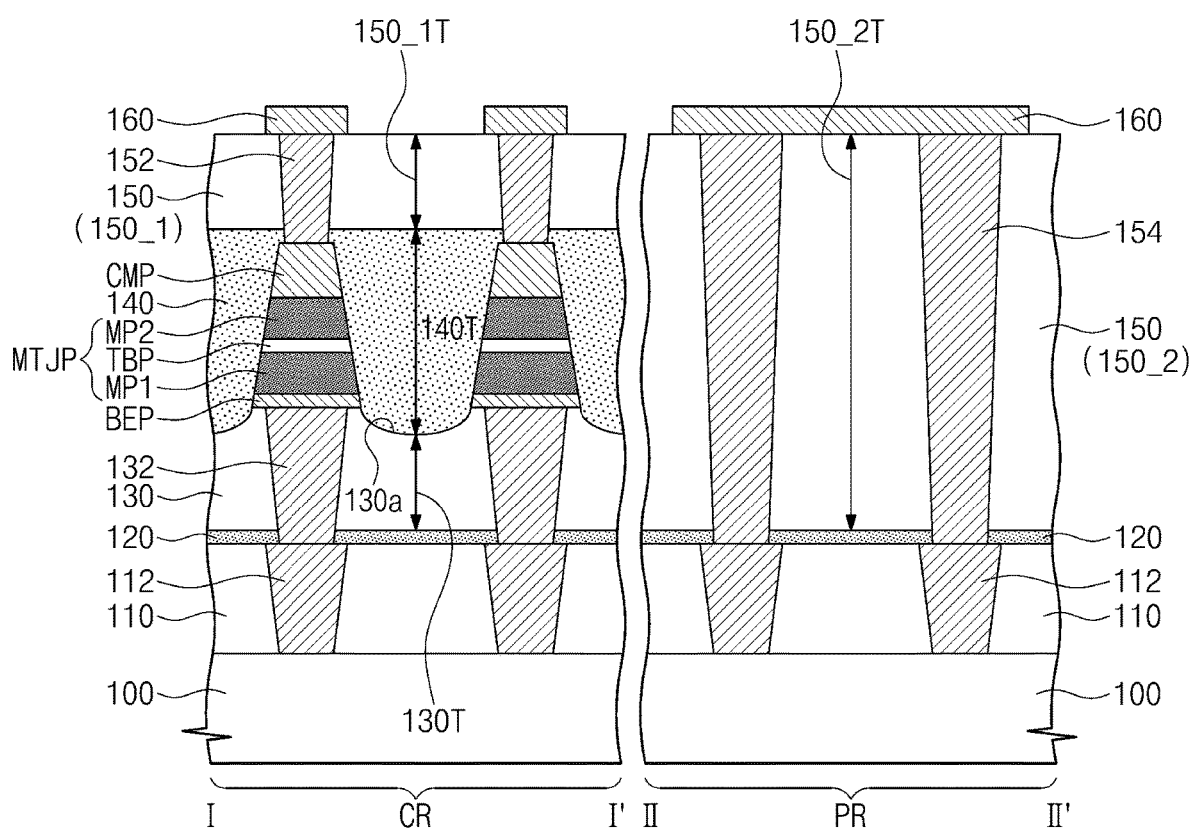

The capping insulation layer 1340 may have a top surface that is substantially flat. The top surface of the capping insulation layer 140 may be higher than top surfaces of the magnetic tunnel junction patterns MTJP. For example, the top surface of the capping insulation layer 140 may be lower than a top surface of the conductive mask pattern CMP and higher than a bottom surface of the conductive mask pattern CMP. In an embodiment, the conductive mask pattern CMP may have a portion exposed above the capping insulation layer 140. FIGS. 3A and 3B will be referenced below to explain other embodiments in which the top surface of the capping insulation layer 140 is positioned differently from that discussed above.

An upper insulation layer 150 may be provided on the capping insulation layer 140 of the cell region CR and on the etch stop layer 120 of the peripheral region PR. The upper insulation layer 150 may include a first portion 150_1 on the cell region CR and a second portion 150_2 on the peripheral region PR. The first and second portions 150_1 and 150_2 of the upper insulation layer 150 may be connected to each other. The capping insulation layer 140 may be covered with the first portion 150_1 of the upper insulation layer 150, and the etch stop layer 120 may be covered with the second portion 150_2 of the upper insulation layer 150. When a portion of the conductive mask pattern CMP is exposed or revealed above the capping insulation layer 140 as illustrated in FIG. 2, the first portion 150_1 of the upper insulation layer 150 may cover the exposed portion of the conductive mask pattern CMP. The upper insulation layer 150 may include an insulating material. For example, the upper insulation layer 150 may include one or more of silicon oxide, silicon nitride, and silicon oxynitride. Alternatively, the upper insulation layer 150 may include a low-k dielectric material. For example, the upper insulation layer 150 may include one or more of fluorine-doped silicon oxide, carbon-doped silicon oxide, porous silicon oxide, polyimide, polynorbornene, benzocyclobutene, polytetrafluoroethylene (PTFE), hydrogen silsesquioxane (HSQ), and methylsilsesquioxane (MSQ).

The second portion 150_2 of the upper insulation layer 150 may have a portion that horizontally overlaps the capping insulation layer 140. The second portion 150_2 of the upper insulation layer 150 may have another portion that horizontally overlaps the second lower insulation layer 130.

The second portion 150_2 of the upper insulation layer 150 may have a bottom surface lower than the bottom surface of the capping insulation layer 140. For example, the bottom surface of the second portion 150_2 of the upper insulation layer 150 may be at substantially the same level as that of a bottom surface of the second lower insulation layer 130. The second portion 150_2 of the upper insulation layer 150 may have a top surface higher than a top surface of the capping insulation layer 140. For example, the top surface of the second portion 150_2 of the upper insulation layer 150 may be at substantially the same level as that of a top surface of the first portion 150_1 of the upper insulation layer 150.

The second portion 150_2 of the upper insulation layer 150 may have a thickness 150_2T, which is greater than a thickness 150_1T of the first portion 150_1 of the upper insulation layer 150 and is also greater than the thickness 140T of the capping insulation layer 140. The thickness 150_2T of the second portion 150_2 of the upper insulation layer 150 may be greater than a sum of the thickness 150_1T of the first portion 150_1 of the upper insulation layer 150 and the thickness 140T of the capping insulation layer 140.

The upper insulation layer 150 may be provided therein with first top contacts 152 and second top contacts 154. For example, the first top contacts 152 may be provided on the cell region CR, and the second top contacts 154 may be provided on the peripheral region PR. The first top contacts 152 may penetrate the first portion 150_1 of the upper insulation layer 150 and be electrically connected to corresponding conductive mask patterns CMP. The second top contacts 154 may penetrate the etch stop layer 120 and the second portion 150_2 of the upper insulation layer 150 and be electrically connected to corresponding lower lines 112. The first and second top contacts 152 and 154 may include a conductive material. For example, the first and second top contacts 152 and 154 may include one or more of doped semiconductor, metal, conductive metal nitride, and metal-semiconductor compound.

Upper lines 160 may be provided on the upper insulation layer 150. The upper lines 160 may be electrically connected to the first and second top contacts 152 and 154. The upper lines 160 may include a conductive material. For example, the upper lines 160 may include one or more of doped semiconductor, metal, conductive metal nitride, and metal-semiconductor compound.

The cell and peripheral regions CR and PR may include components different from each other, so that their requirements on interlayer dielectric characteristics may also be different from each other. According to embodiments of the present inventive concept, the cell and peripheral regions CR and PR may have their interlayer dielectric structures different from each other. For example, the interlayer dielectric structure of the cell region CR may include the second lower insulation layer 130, the capping insulation layer 140, and the first portion 150_1 of the upper insulation layer 150 that are sequentially stacked. In contrast, the interlayer dielectric structure of the peripheral region PR may include the second portion 150_2 of the upper insulation layer 150. Accordingly, the cell and peripheral regions CR and PR may be individually provided with an interlayer dielectric structure having required characteristics. For example, the upper insulation layer 150 may include a low-k dielectric material, and thus a parasitic capacitance may be reduced between the second top contacts 154.

FIG. 3A illustrates a simplified cross-sectional view of a semiconductor device according to exemplary embodiments of the present inventive concept. FIG. 3A is a cross-sectional view taken along lines I-I' and II-II' of FIG. 1.

Referring to FIGS. 1 and 3A, the configuration of a semiconductor device of FIG. 3A may be substantially the same as that discussed with reference to FIGS. 1 and 2, except for the level of the top surface of the capping insulation layer 140.

In some embodiments, as illustrated in FIG. 3A, the top surface of the capping insulation layer 140 may be at substantially the same level as those of the top surfaces of the conducive mask patterns CMP. For example, the top surface of the capping insulation layer 140 may be coplanar with the top surface of the conductive mask pattern CMP.

The first portion 150_1 of the upper insulation layer 150 may cover the top surface of the capping insulation layer 140 and the top surfaces of the conducive mask patterns CMP. The first portion 150_1 of the upper insulation layer 150 may have a bottom surface that is substantially flat.

FIG. 3B illustrates a simplified cross-sectional view of a semiconductor device according to exemplary embodiments of the present inventive concept. In detail, FIG. 3B is a cross-sectional view taken along lines I-I' and II-II' of FIG. 1. Referring to FIGS. 1 and 3B, the configuration of a semiconductor device of FIG. 3B may be substantially the same as that discussed with reference to FIGS. 1 and 2, except for the level of the top surface of the capping insulation layer 140.

In some embodiments, as illustrated in FIG. 3B, the top surface of the capping insulation layer 140 may be at a higher level than those of the top surfaces of the conducive mask patterns CMP. In this configuration, the capping insulation layer 140 may cover the top surfaces of the conductive mask patterns CMP.

The first portion 150_1 of the upper insulation layer 150 may cover the top surface of the capping insulation layer 140. The first portion 150_1 of the upper insulation layer 150 may have a bottom surface that is substantially flat.

Figure 4:
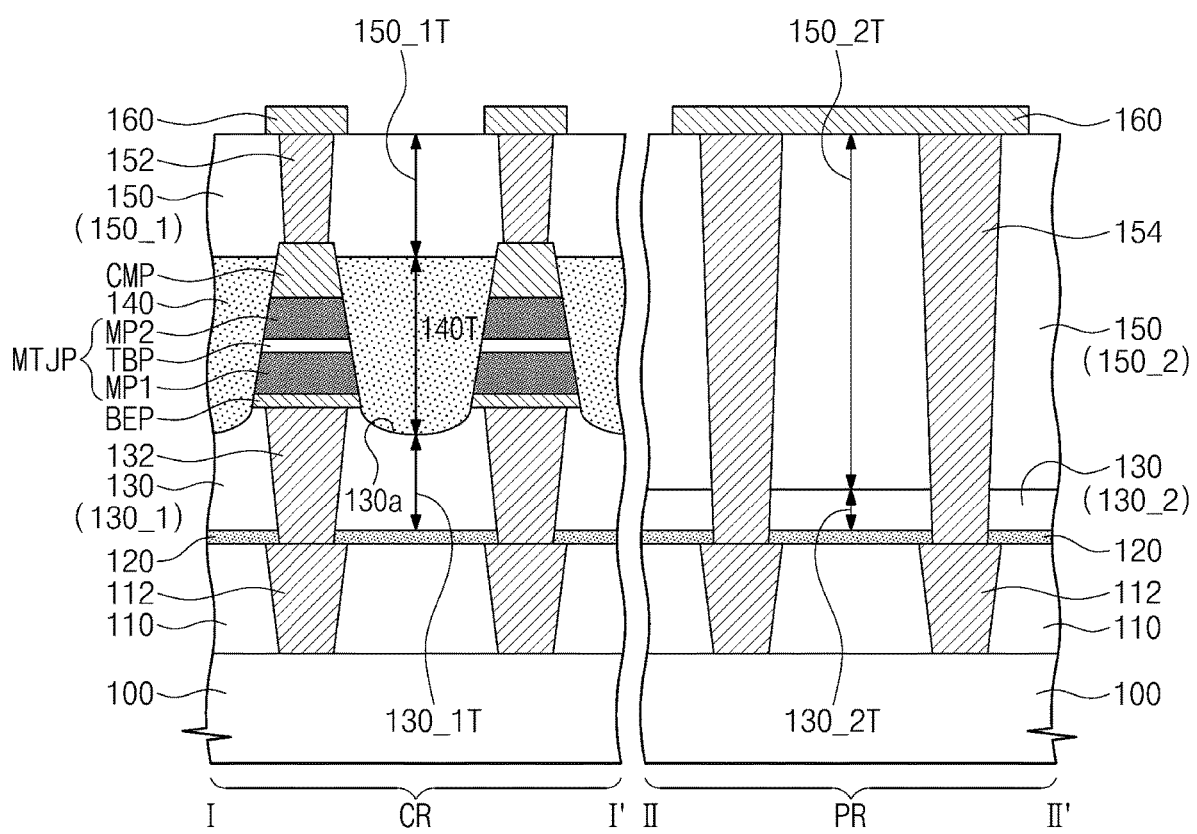
FIG. 4 illustrates a cross-sectional view of a semiconductor device according to exemplary embodiments of the present inventive concept.

FIG. 4 illustrates a cross-sectional view of a semiconductor device according to exemplary embodiments of the present inventive concept. FIG. 4 is a cross-sectional view taken along lines I-I' and II-II' of FIG. 1. Referring to FIGS. 1 and 4, the configuration of a semiconductor device of FIG. 4 may be substantially the same as that discussed with reference to FIGS. 1 and 2, except for the second lower insulation layer 130.

In some embodiments, as illustrated in FIG. 4, the second lower insulation layer 130 may include a first portion 130_1 on the cell region CR and a second portion 130_2 on the peripheral region PR.

The first portion 130_1 of the second lower insulation layer 130 may be substantially the same as the second lower insulation layer 130 discussed with reference to FIGS. 1 and 2.

The second portion 130_2 of the second lower insulation layer 130 may lie between the etch stop layer 120 and the second portion 150_2 of the upper insulation layer 150. The second portion 130_2 of the second lower insulation layer 130 may be connected to the first portion 130_1 of the second lower insulation layer 130. For example, the second portion 130_2 of the second lower insulation layer 130 may be a portion extending from the first portion 130_1 of the second lower insulation layer 130.

The second portion 130_2 of the second lower insulation layer 130 may have a thickness 130_2T less than a thickness 130_1T of the first portion 130_1 of the second lower insulation layer 130. The second portion 130_2 of the second lower insulation layer 130 may have a bottom surface at substantially the same level as that of a bottom surface of the first portion 130_1 of the second lower insulation layer 130. For example, the bottom surface of the second portion 130_2 of the second lower insulation layer 130 may be coplanar with the bottom surface of the first portion 130_1 of the second lower insulation layer 130. The second portion 130_2 of the second lower insulation layer 130 may have a top surface lower than a top surface of the first portion 130_1 of the second lower insulation layer 130.

The bottom surface of the second portion 150_2 of the upper insulation layer 150 may be higher than the bottom surface of the first portion 130_1 of the second lower insulation layer 130 and lower than the top surface of the first portion 130_1 of the second lower insulation layer 130.

The second top contacts 154 may penetrate the etch stop layer 120, the second portion 130_2 of the second lower insulation layer 130, and the second portion 150_2 of the upper insulation layer 150 and be electrically connected to corresponding lower lines 112.

FIG. 4 illustrates that the top surface of the capping insulation layer 140 is lower than the top surface of the conductive mask pattern CMP and higher than the bottom surface of the conductive mask pattern CMP. In an embodiment, the top surface of the capping insulation layer 140 may be at substantially the same level as those of the top surfaces of the conducive mask patterns CMP. Alternatively, the top surface of the capping insulation layer 140 may be at a higher level than those of the top surfaces of the conductive mask patterns CMP.

Figure 5A:
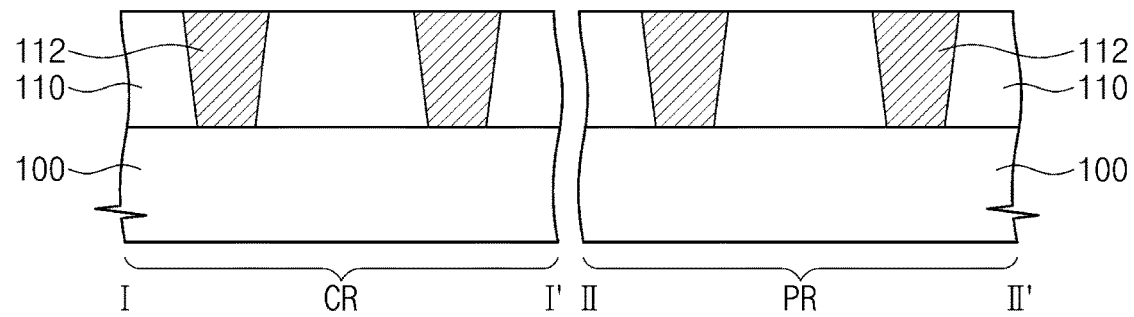
FIGS. 5A to 5J illustrate cross-sectional views showing a method of manufacturing a semiconductor device according to exemplary embodiments of the present inventive concept.

FIGS. 5A to 5J illustrate cross-sectional views showing a method of manufacturing a semiconductor device according to exemplary embodiments of the present inventive concept. In detail, FIGS. 5A to 5J are cross-sectional views taken along lines I-I' and II-II' of FIG. 1. Referring to FIGS. 1 and 5A, a substrate 100 may be provided. In an embodiment, the substrate 100 may include a cell region CR and a peripheral region PR. The substrate 100 may include a semiconductor substrate.

Select elements and/or the logic circuits may be formed on the substrate 100. For example, the select elements may be formed on the cell region CR, and the logic circuits may be formed on the peripheral region PR. The select elements and the logic circuits may be, for example, transistors or diodes.

A first interlayer insulation layer 110 may be formed on the substrate 100. The first lower insulation layer 110 may be formed on the cell and peripheral regions CR and PR. For example, the first lower insulation layer 110 may cover the select elements and the logic circuits. The first lower insulation layer 110 may include an insulating material. The first lower insulation layer 110 may be formed by, for example, chemical vapor deposition, physical vapor deposition, or spin coating.

Lower lines 112 may be formed in the first lower insulation layer 110. The lower lines 112 may be electrically connected to the select elements and the logic circuits. The lower lines 112 may include a conductive material.

Figure 5B:
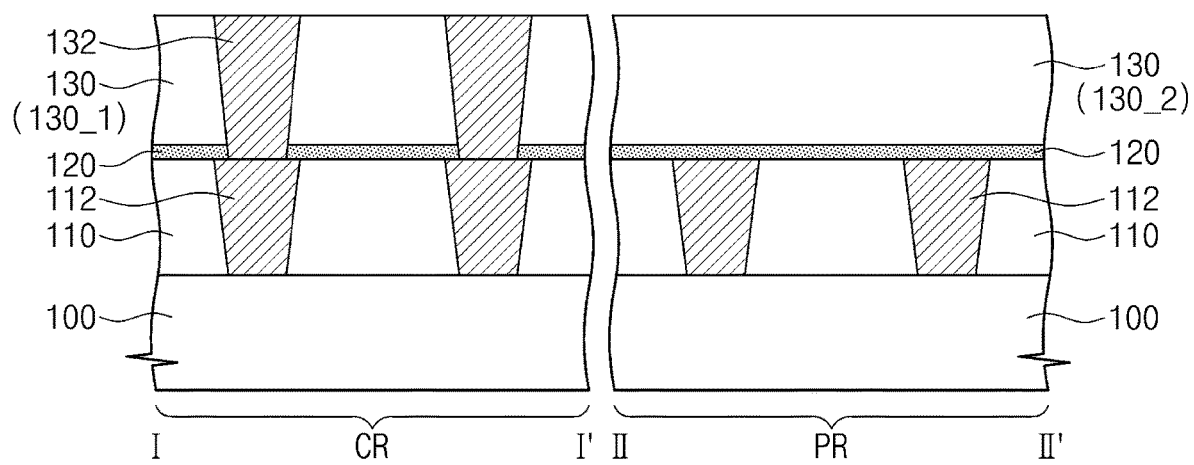

Referring to FIGS. 1 and 5B, an etch stop layer 120 and a second lower insulation layer 130 may be sequentially formed on the first lower insulation layer 110. Each of the etch stop layer 120 and the second lower insulation layer 130 may be formed on the cell and peripheral regions CR and PR. The second lower insulation layer 130 may thus include a first portion 130_1 on the cell region CR and a second portion 130_2 on the peripheral region PR.

The etch stop layer 120 may include a material exhibiting an etch selectivity to the second lower insulation layer 130. For example, the etch stop layer 120 may include silicon carbon nitride, and the second lower insulation layer 130 may include one or more of silicon oxide, silicon nitride, and silicon oxynitride. The etch stop layer 120 and the second lower insulation layer 130 may be formed by, for example, chemical vapor deposition, physical vapor deposition, or spin coating.

Bottom contacts 132 may be formed in the first portion 130_1 of the second lower insulation layer 130. The bottom contacts 132 may not be formed in the second portion 130_2 of the second lower insulation layer 130. For example, the bottom contacts 132 may be formed on the cell region CR but not on the peripheral region PR. The bottom contacts 132 may penetrate the first portion 130_1 of the second lower insulation layer 130 and the etch stop layer 120 and be electrically connected to corresponding lower lines 112. The bottom contacts 132 may include a conductive material.

Figure 5C:
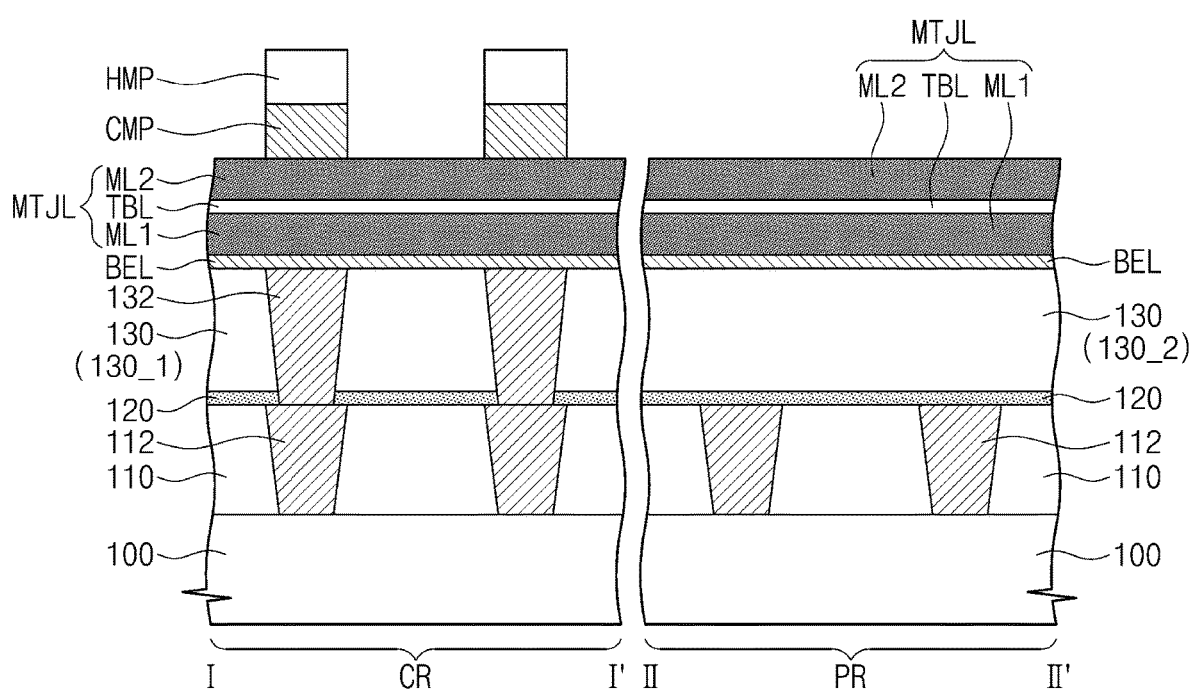

Referring to FIGS. 1 and 5C, a bottom electrode layer BEL and a magnetic tunnel junction layer MTJL may be sequentially formed on the second lower insulation layer 130. Each of the bottom electrode layer BEL and the magnetic tunnel junction layer MTJL may be formed on the cell and peripheral regions CR and PR. The formation of the magnetic tunnel junction layer MTJL may include sequentially forming a first magnetic layer ML1, a tunnel barrier layer TBL, and a second magnetic layer ML2. The bottom electrode layer BEL may include, for example, conductive metal nitride such as titanium nitride and/or tantalum nitride. The bottom electrode layer BEL and the magnetic tunnel junction layer MTJL may be formed by, for example, chemical vapor deposition or physical vapor deposition. In some embodiments, the formation of the bottom electrode layer BEL may be skipped.

Conductive mask patterns CMP may be formed on the magnetic tunnel junction layer MTJL. The conductive mask patterns CMP may be formed on the cell region CR but not on the peripheral region PR. The conductive mask patterns CMP may be spaced apart from each other. For example, as viewed in plan, the conductive mask patterns CMP may be formed to correspond to the bottom contacts 132. The formation of the conductive mask patterns CMP may include forming a conductive mask layer (not shown) on the magnetic tunnel junction layer MTJL, forming hardmask patterns HMP on the conductive mask layer, and patterning the conductive mask layer using the hardmask patterns as an etch mask. The conductive mask patterns CMP may include, for example, tungsten, tantalum, aluminum, copper, titanium, and/or conductive metal nitride thereof.

Figure 5D:
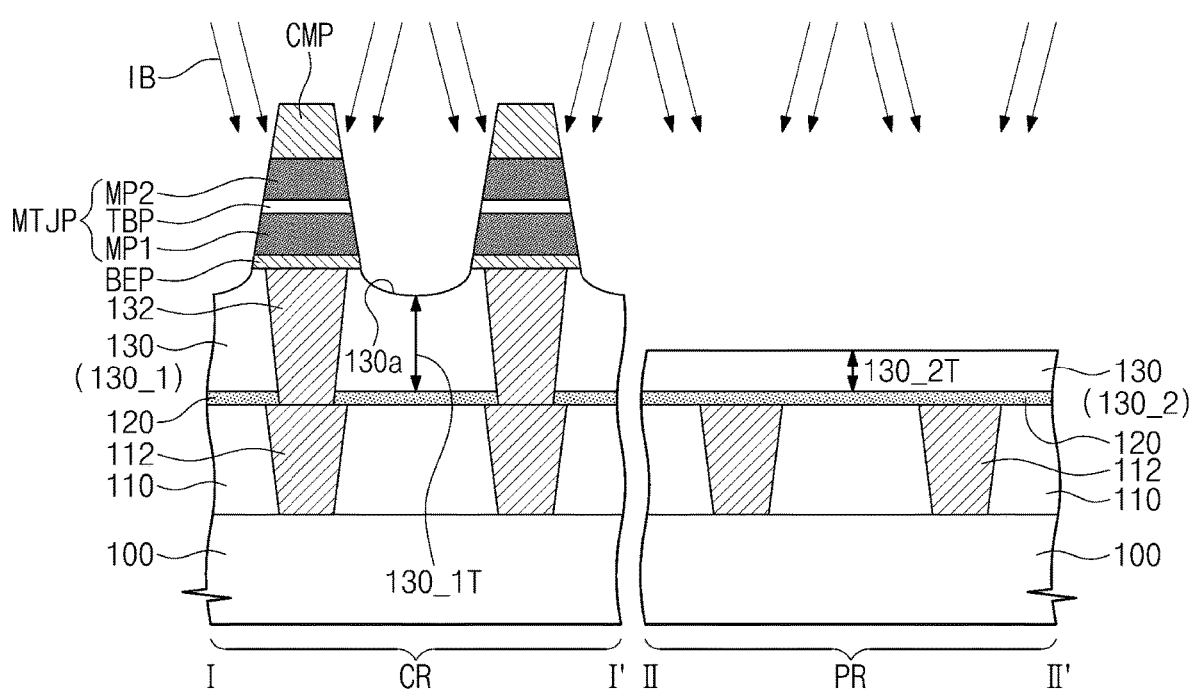

Referring to FIGS. 1 and 5D, bottom electrode patterns BEP and magnetic tunnel junction patterns MTJP may be formed. The formation of the bottom electrode patterns BEP and the magnetic tunnel junction patterns MTJP may include using the conductive mask patterns CMP as an etch mask to sequentially pattern the magnetic tunnel junction layer MTJL and the bottom electrode layer BEL.

An ion beam etching process may be employed to pattern the magnetic tunnel junction layer MTJL and the bottom electrode layer BEL. For example, the tunnel junction layer MTJL and the bottom electrode layer BEL may be irradiated with an ion beam IB and may then be patterned. The ion beam IB may be irradiated in an inclined direction against a top surface of the substrate 100. When the ion beam IB is irradiated, the substrate 100 may rotate around a rotational axis perpendicular to its top surface, and as a result, a symmetrical etching may be performed on the magnetic tunnel junction layer MTJL and the bottom electrode layer BEL that are exposed through the conductive mask patterns CMP.

The ion beam etching process may be performed such that the first portion 130_1 of the second lower insulation layer 130 may be exposed between the magnetic tunnel junction patterns MTJP (or between the bottom electrode patterns BEP) and the second portion 130_2 of the second lower insulation layer 130 may also be exposed. The ion beam etching process may be performed until the first portion 130_1 of the second lower insulation layer 130 may be partially etched between the magnetic tunnel junction patterns MTJP (or between the bottom electrode patterns BEP). Therefore, the first portion 130_1 of the second lower insulation layer 130 may have a top surface including concave portions 130a that are concavely recessed toward the substrate 100 between the magnetic tunnel junction patterns MTJP.

The ion beam etching process may remove the magnetic tunnel junction layer MTJL and the bottom electrode layer BEL on the peripheral region PR and may partially remove the second portion 130_2 of the second lower insulation layer 130.

When the ion beam etching process is performed, the magnetic tunnel junction layer MTJL, the bottom electrode layer BEL, and the second portion 130_2 of the second lower insulation layer 130 on the peripheral region PR may be etched at a higher etch rate than that of the magnetic tunnel junction layer MTJL, the bottom electrode layer BEL, and the first portion 130_1 of the second lower insulation layer 130 on the cell region CR. This difference in etch rate may be caused by a shadowing effect due to the magnetic tunnel junction patterns MTJP formed on the cell region CR.

Accordingly, during the ion beam etching process, the second portion 130_2 of the second lower insulation layer 130 may be removed faster than the first portion 130_1 of the second lower insulation layer 130. In conclusion, after the ion beam etching process is performed, the second portion 130_2 of the second lower insulation layer 130 may have a top surface lower than that of the first portion 130_1 of the second lower insulation layer 130. For example, after the ion beam etching process is performed, the second portion 130_2 of the second lower insulation layer 130 may have a thickness 130_2T less than a thickness 130_1T of the first portion 130_1 of the second lower insulation layer 130.

Figure 5E:
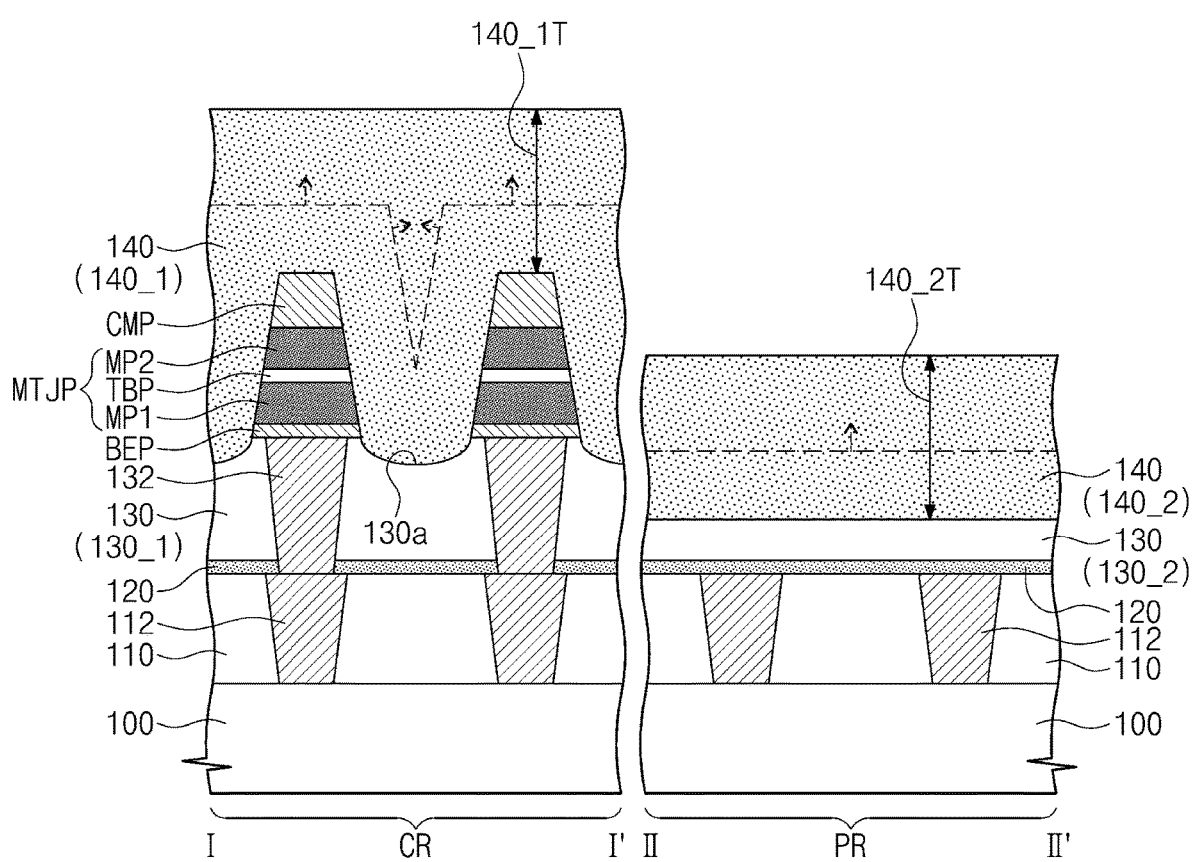

Referring to FIGS. 1 and 5E, a capping insulation layer 140 may be formed to cover the magnetic tunnel junction patterns MTJP. The capping insulation layer 140 may be formed on the cell and peripheral regions CR and PR. The capping insulation layer 140 may include a first portion 140_1 on the cell region CR and a second portion 140_2 on the peripheral region PR. A gap between the magnetic tunnel junction patterns MTJP may be filled with the capping insulation layer 140. The capping insulation layer 140 may include an insulating material.

The capping insulation layer 140 may be formed by a deposition process having excellent step coverage. Thus, the formation rate of the capping insulation layer 140 on sidewalls of the magnetic tunnel junction patterns MTJP and on sidewalls of the conductive mask patterns CMP may be substantially the same as or similar to the formation rate of the capping insulation layer 140 on top surfaces of the conductive mask patterns CMP and on the top surface of the second portion 130_2 of the second lower insulation layer 130. In FIG. 5E, the capping insulation layer 140 is illustrated to include therein a dotted line that represents a shape and a deposition direction of the capping insulation layer 140 in the middle of the deposition process.

The formation rate of the capping insulation layer 140 on the top surfaces of the conductive mask patterns CMP may be substantially the same as the formation rate of the capping insulation layer 140 on the top surface of the second portion 130_2 of the second lower insulation layer 130. The first portion 140_1 of the capping insulation layer 140 formed on the top surfaces of the conductive mask patterns CMP may thus have a thickness 140_1T substantially the same as a thickness 140_2T of the second portion 140_2 of the capping insulation layer 140 formed on the top surface of the second portion 130_2 of the second lower insulation layer 130.

Figure 5F:
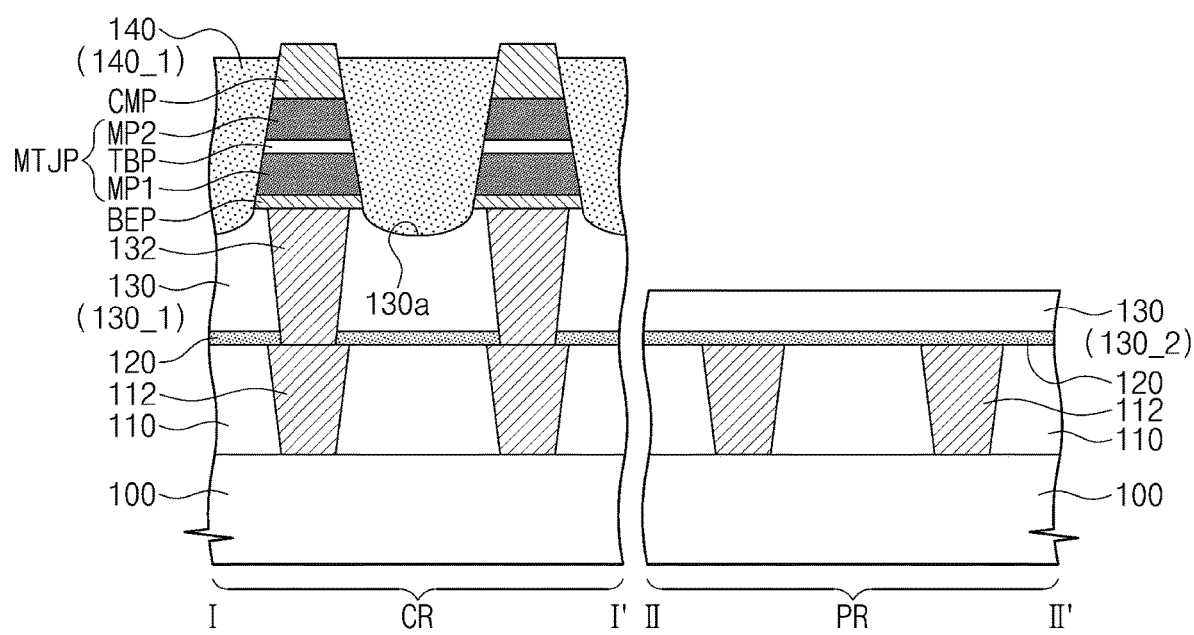

Referring to FIGS. 1 and 5F, the second portion 140_2 of the capping insulation layer 140 may be removed. The second portion 140_2 of the capping insulation layer 140 may be removed by, for example, an etch-back process performed on an entire surface of the capping insulation layer 140. The etch-back process may be performed without using a separate mask pattern.

When the second portion 140_2 of the capping insulation layer 140 is removed, the first portion 140_1 of the capping insulation layer 140 may also be partially removed. The first portion 140_1 of the capping insulation layer 140 may therefore have a reduced top surface. In some embodiments, as illustrated in FIG. 5F, the top surface of the first portion 140_1 of the capping insulation layer 140 may be at a lower level than those of the top surfaces of the conducive mask patterns CMP. In other embodiments, as illustrated in FIG. 3A, the top surface of the first portion 140_1 of the capping insulation layer 140 may be at substantially the same level as those of the top surfaces of the conducive mask patterns CMP. In certain embodiments, as illustrated in FIG. 3B, the top surface of the first portion 140_1 of the capping insulation layer 140 may still be at a higher level than those of the top surfaces of the conducive mask patterns CMP. The first portion 140_1 of the capping insulation layer 140 may remain in the gap between the magnetic tunnel junction patterns MTJP. The first portion 140_1 of the capping insulation layer 140 remaining in the gap may have a top surface higher than the bottom surfaces of the conductive mask patterns CMP. For example, the top surface of the first portion 140_1 of the capping insulation layer 140 remaining in the gap may be at a higher level than those of top surfaces of the magnetic tunnel junction patterns MTJP.

Since the second portion 140_2 of the capping insulation layer 140 is removed, the top surface of the second portion 130_2 of the second lower insulation layer 130 may be exposed. In contrast, the top surface of the first portion 130_1 of the second lower insulation layer 130 may be covered with the first portion 140_1 of the capping insulation layer 140 remaining between the magnetic tunnel junction patterns MTJP.

Figure 5G:
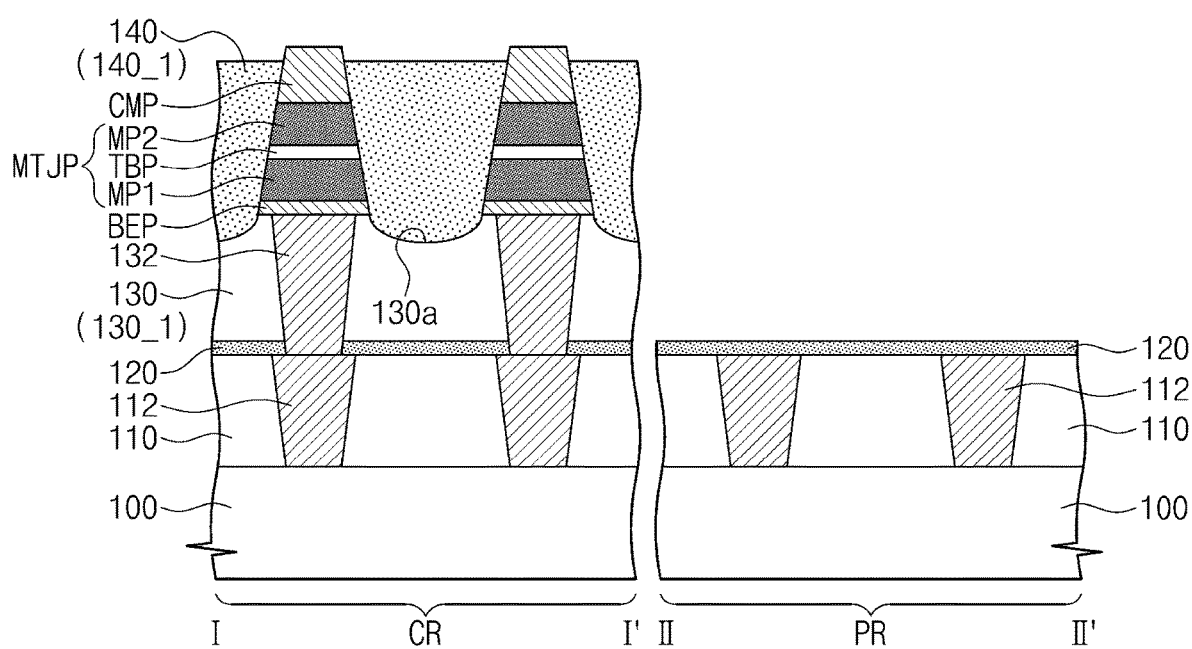

Referring to FIGS. 1 and 5G, a removal process may be performed on the second portion 130_2 of the second lower insulation layer 130. The removal process may include using the first portion 140_1 of the capping insulation layer 140 and the conductive mask patterns CMP as an etch mask to isotropically etch the second portion 130_2 of the second lower insulation layer 130. When the second portion 130_2 of the second lower insulation layer 130 is removed, the etch stop layer 120 may appear on the peripheral region PR.

In some embodiments, the removal process on the second portion 130_2 of the second lower insulation layer 130 may be skipped. In these cases, as discussed with reference to FIG. 4, the second portion 130_2 of the second lower insulation layer 130 may still remain.

Figure 5H:
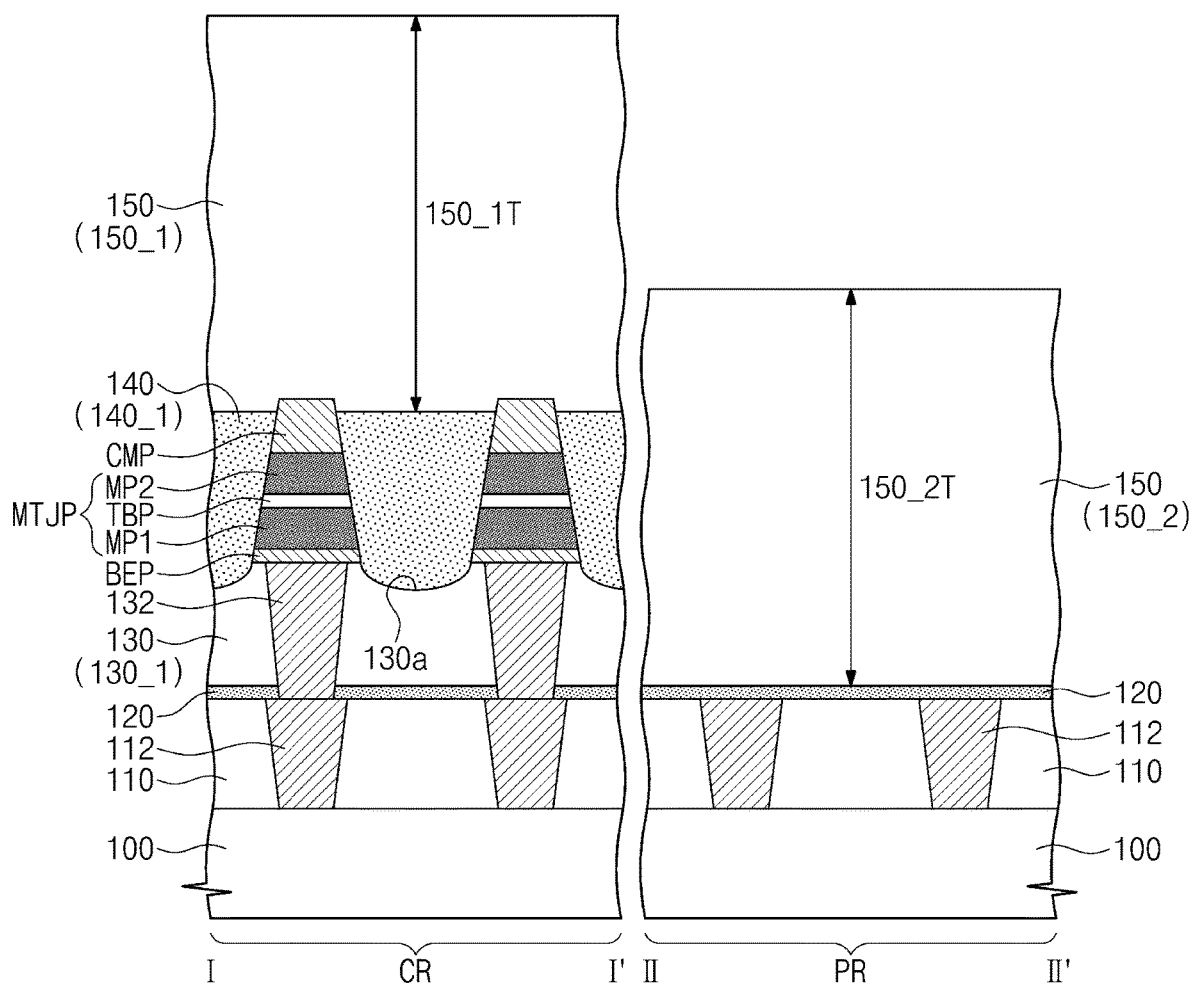

Referring to FIGS. 1 and 5H, an upper insulation layer 150 may be formed to cover an entire surface of the substrate 100. The upper insulation layer 150 may include a first portion 150_1 on the cell region CR and a second portion 150_2 on the peripheral region PR. The first portion 150_1 of the upper insulation layer 150 may cover the first portion 140_1 of the capping insulation layer 140, and the second portion 150_2 of the upper insulation layer 150 may cover the etch stop layer 120. The first portion 150_1 of the upper insulation layer 150 may have a thickness 150_1T substantially the same as a thickness 150_2T of the second portion 150_2 of the upper insulation layer 150. The first portion 150_1 of the upper insulation layer 150 may have a top surface higher than that of the second portion 150_2 of the upper insulation layer 150. The upper insulation layer 150 may include an insulating material, for example, a low-k dielectric material. The upper insulation layer 150 may be formed by, for example, chemical vapor deposition, physical vapor deposition, or spin coating.

Figure 5I:
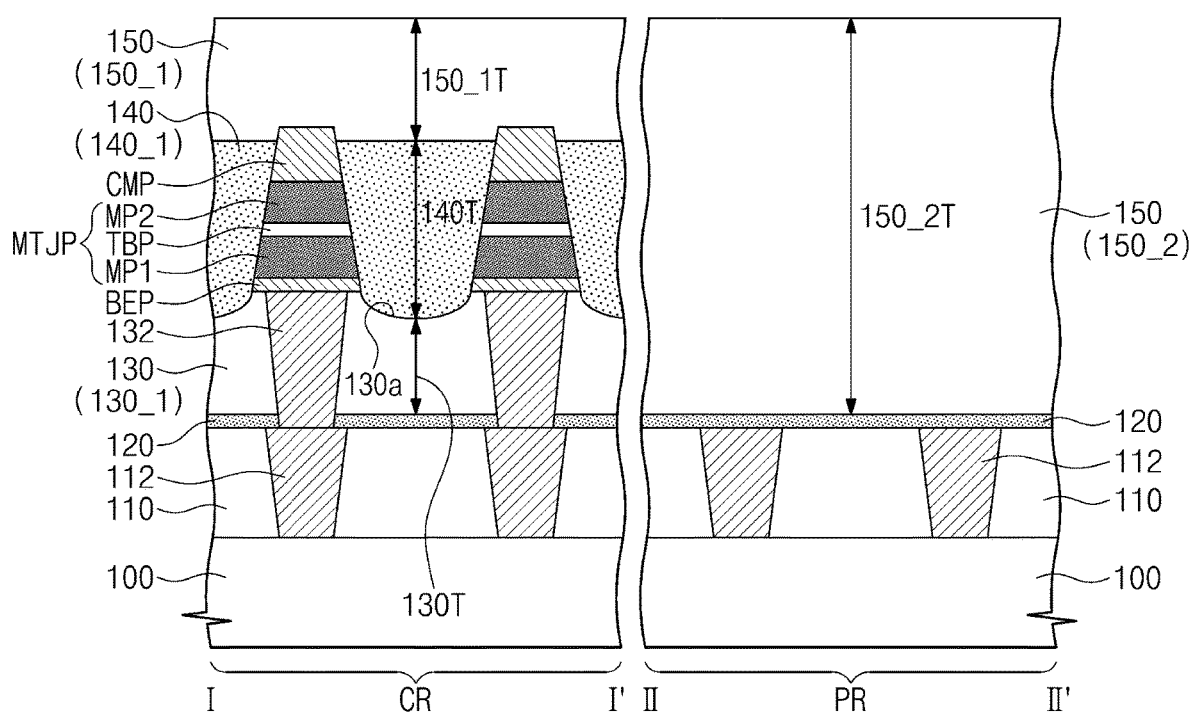

Referring to FIGS. 1 and 5I, a process may be performed to remove an upper portion of the first portion 150_1 of the upper insulation layer 150. The removal of the upper portion of the first portion 150_1 of the upper insulation layer 150 may include forming a mask pattern (not shown) exposing the first portion 150_1 of the upper insulation layer 150, using the mask pattern as an etch mask to etch the first portion 150_1 of the upper insulation layer 150, and performing a planarization process on the upper insulation layer 150.

The removal process may be performed such that the thickness 150_1T of the first portion 150_1 of the upper insulation layer 150 may become reduced below the thickness 150_2T of the second portion 150_2 of the upper insulation layer 150. In addition, the removal process may be performed such that the top surface of the first portion 150_1 of the upper insulation layer 150 may have a reduced level. For example, after the removal process is performed, the top surface of the first portion 150_1 of the upper insulation layer 150 may be at substantially the same level as that of the top surface of the second portion 150_2 of the upper insulation layer 150.

After the removal process is performed, a relationship among the thickness 130T of the first portion 130_1 of the second lower insulation layer 130, the thickness 140T of the first portion 140_1 of the capping insulation layer 140, the thickness 150_1T of the first portion 150_1 of the upper insulation layer 150, and the thickness 150_2T of the second portion 150_2 of the upper insulation layer 150 may be the same as that discussed with reference to FIGS. 1 and 2.

Figure 5J:
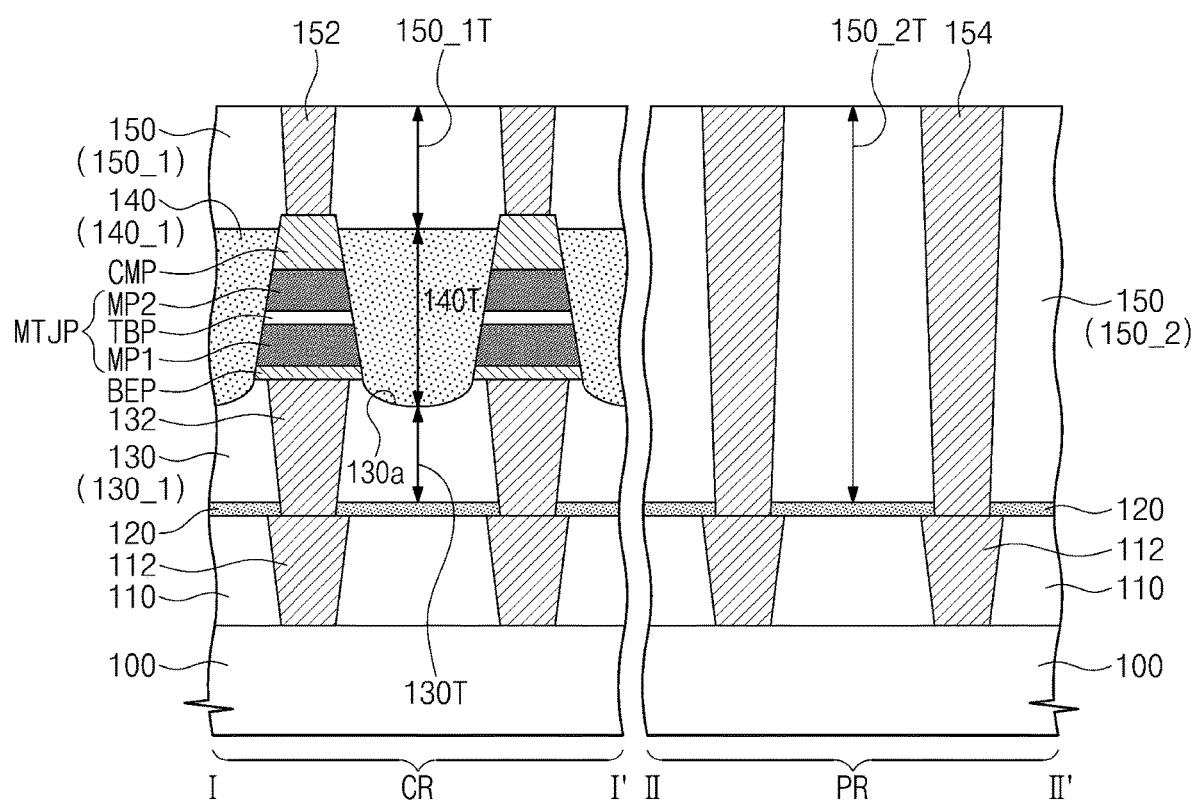

Referring to FIGS. 1 and 5J, first top contacts 152 and second top contacts 154 may be formed in the upper insulation layer 150. The first top contacts 152 may be formed in the first portion 150_1 of the upper insulation layer 150, and the second top contacts 154 may be formed in the second portion 150_2 of the upper insulation layer 150. The first top contacts 152 may be electrically connected to the conductive mask patterns CMP, and the second top contacts 154 may be electrically connected to the lower lines 112. The first and second upper contacts 152 and 154 may include a conductive material.

Referring back to FIGS. 1 and 2, upper lines 160 may be formed on the upper insulation layer 150. The upper lines 160 may be electrically connected to the first and second top contacts 152 and 154. The upper lines 160 may include a conductive material.

Figure 6A:
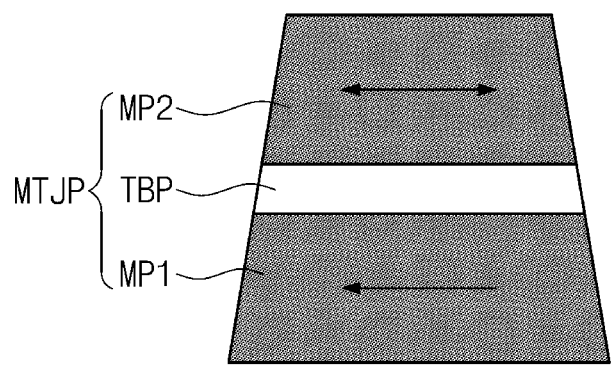
FIGS. 6A and 6B illustrate conceptual diagrams showing magnetic tunnel junction patterns according to exemplary embodiments of the present inventive concept.
Figure 6B:
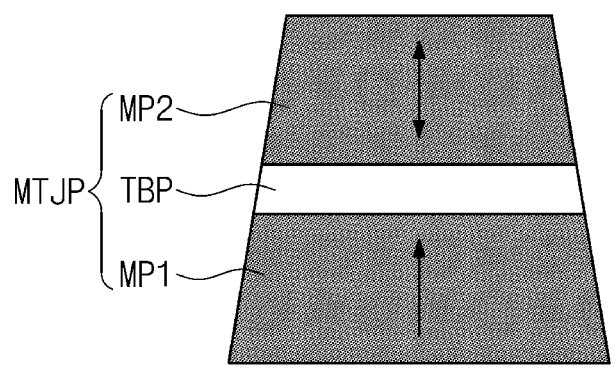

FIGS. 6A and 6B illustrate conceptual diagrams showing magnetic tunnel junction patterns according to exemplary embodiments of the present inventive concept. Each of the magnetic tunnel junction patterns MTJP may include a first magnetic pattern MP1, a tunnel barrier pattern TBP, and a second magnetic pattern MP2. One of the first and second magnetic patterns MP1 and MP2 may be a free pattern of a magnetic tunnel junction, and the other of the first and second magnetic patterns MP1 and MP2 may be a reference pattern of a magnetic tunnel junction. For brevity of the description, it will be described hereinafter that the first magnetic pattern MP1 is a reference pattern and the second magnetic pattern MP2 is a free pattern. Alternatively, the first magnetic pattern MP1 can be a free pattern and the second magnetic pattern MP2 can be a reference pattern. An electrical resistance of the magnetic tunnel junction pattern MTJP may depend on magnetization directions of the free and reference patterns. For example, the electrical resistance of the magnetic tunnel junction pattern MTJP may be much greater when the magnetization directions between the free and reference patterns are anti-parallel than when the magnetization directions between the free and reference patterns are parallel. Consequently, the electrical resistance of the magnetic tunnel junction pattern MTJP may be adjusted by changing the magnetization direction of the free pattern, which may be used as a data storage principle of a magnetic memory device according to exemplary embodiments of the present inventive concept.

Referring to FIG. 6A, the first and second magnetic patterns MP1 and MP2 may be magnetic layers for forming a structure with horizontal magnetization that is substantially parallel to a top surface of the tunnel barrier pattern TBP. In these embodiments, the first magnetic pattern MP1 may include a layer having an anti-ferromagnetic material and a layer having a ferromagnetic material. The layer having an anti-ferromagnetic material may include one or more of PtMn, IrMn, MnO, MnS, MnTe, $MnF_2$, $FeCl_2$, FeO, $CoCl_2$, CoO, $NiCl_2$, NiO, and Cr. In some embodiments, the layer having an anti-ferromagnetic material may include at least one selected from precious metals. The precious metals may include ruthenium (Ru), rhodium (Rh), palladium (Pd), osmium (Os), iridium (Ir), platinum (Pt), gold (Au), or silver (Ag). The layer including a ferromagnetic material may include one or more of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The second magnetic pattern MP2 may include a material having a changeable magnetization direction. The second magnetic pattern MP2 may include a ferromagnetic material. For example, the second magnetic pattern MP2 may include one or more of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The second magnetic pattern MP2 may include a plurality of layers. For example, the second magnetic pattern MP2 may include a plurality of layers having a plurality of ferromagnetic materials and a layer having a non-magnetic material between the plurality of layers. In this case, the layers having the ferromagnetic materials and the layer having the non-magnetic material may constitute a synthetic anti-ferromagnetic layer. The synthetic anti-ferromagnetic layer may reduce critical current density and enhance thermal stability of magnetic memory devices.

The tunnel barrier pattern TBP may include one or more of oxide of magnesium (Mg), oxide of titanium (Ti), oxide of aluminum (Al), oxide of magnesium-zinc (MgZn), oxide of magnesium-boron (MgB), nitride of titanium (Ti), and nitride of vanadium (V). For example, the tunnel barrier pattern TBP may be a single or monolayer of magnesium oxide (MgO). Alternatively, the tunnel barrier pattern TBP may include a plurality of layers. A chemical vapor deposition (CVD) process may be used to form the tunnel barrier pattern TBP.

Referring to FIG. 6B, the first and second magnetic patterns MP1 and MP2 may be magnetic layers for forming a structure with perpendicular magnetization that is substantially perpendicular to a top surface of the tunnel barrier pattern TBP. In these embodiments, the first and second magnetic patterns MP1 and MP2 may include one or more of a material having an $L_{10}$ crystal structure, a material having a hexagonal close-packed lattice, and an amorphous RE-TM (Rare Earth Transition Metal) alloy. For example, the first and second magnetic patterns MP1 and MP2 may include at least one material having an $L_{10}$ crystal structure such as $Fe_{50}Pt_{50}$, $Fe_{50}Pd_{50}$, $Co_{50}Pt_{50}$, $Co_{50}Pd_{50}$, and $Fe_{50}Ni_{50}$. Alternatively, the first and second magnetic patterns MP1 and MP2 may include $Co_3Pt$ ordered alloys or cobalt-platinum (CoPt) disordered alloys in which platinum (Pt) is contained to have a content ranging from 10 to 45 at. % having a hexagonal close-packed lattice. Dissimilarly, the first and second magnetic patterns MP1 and MP2 may include at least one of amorphous RE-TM alloys, which contain both one or more of iron (Fe), cobalt (Co), and nickel (Ni) and one or more of rare earth metals such as terbium (Tb), dysprosium (Dy), and gadolinium (Gd).

The first and second magnetic patterns MP1 and MP2 may include a material exhibiting interface perpendicular magnetic anisotropy. The interface perpendicular magnetic anisotropy may refer to a phenomenon where a magnetic layer having an intrinsic in-plane magnetization property has a perpendicular magnetization direction due to an effect from an interface with another layer adjacent to the magnetic layer. The term "intrinsic in-plane magnetic property" means that a magnetic layer has a magnetization direction parallel to its widest surface (or a longitudinal direction) thereof when there is no external factor applied thereto. For example, when a substrate is provided thereon with a magnetic layer having the intrinsic in-plane magnetization property and no external factor is applied, a magnetization direction of the magnetic layer may be oriented substantially parallel to a top surface of the substrate.

For example, the first and second magnetic patterns MP1 and MP2 may include one or more of cobalt (Co), iron (Fe), and nickel (Ni). The first and second magnetic patterns MP1 and MP2 may further include at least one of non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), nitrogen (N), or any combination thereof. For example, the first and second magnetic patterns MP1 and MP2 may include CoFe or NiFe, and may further include boron (B). Additionally, in order to reduce saturation magnetization, the first and second magnetic patterns MP1 and MP2 may further include one or more of titanium (Ti), aluminum (Al), silicon (Si), magnesium (Mg), tantalum (Ta), and silicon (Si). The first and second magnetic patterns MP1 and MP2 may be formed using a sputtering process or a chemical mechanical deposition (CVD) process.

The magnetic tunnel junction layer MTJL discussed with reference to FIG. 5C may include substantially the same material as that of the magnetic tunnel junction pattern MTJP.

According to embodiments of the present inventive concept, the cell and peripheral regions may have their interlayer dielectric structures different from each other. Accordingly, the cell and peripheral regions may be individually provided with an interlayer dielectric structure having required characteristics. For example, the upper insulation may be formed of a low-k dielectric material, and thus a parasitic capacitance may be reduced between the second top contacts.

Although the present invention has been described in connection with the embodiments of the present invention illustrated in the accompanying drawings, it will be understood to those skilled in the art that various changes and modifications may be made without departing from the technical spirit and essential feature of the present invention. It will be apparent to those skilled in the art that various substitution, modifications, and changes may be thereto without departing from the scope and spirit of the inventive concept.

What is claimed is:

1. A semiconductor device, comprising:
a substrate including a cell region and a peripheral region;
a magnetic tunnel junction pattern on the cell region;
a capping insulation layer covering a sidewall of the magnetic tunnel junction pattern;
a conductive mask pattern on the magnetic tunnel junction pattern;
a lower insulation layer between the capping insulation layer and the substrate; and
an upper insulation layer including a first portion on the capping insulation layer and a second portion on the substrate in the peripheral region,
wherein a top edge of the capping insulation layer is in direct contact with a point on a sidewall of the conductive mask pattern, the point being between top and bottom surfaces of the conductive mask pattern,
wherein a bottom surface of the second portion is disposed lower than a bottom surface of the capping insulation layer,
wherein the lower insulation layer has a top surface including a concave portion in contact with the capping insulation layer,
wherein the bottom surface of the capping insulation layer and the top surface of the lower insulation layer are both disposed lower than a bottom surface of the magnetic tunnel junction pattern, and
wherein the capping insulation layer is interposed between the upper insulation layer and the concave portion to completely fill the concave portion below the magnetic tunnel junction pattern, and an entire top surface of the capping insulation layer is substantially flat.

2. The semiconductor device of claim 1, wherein the second portion of the upper insulation layer has a thickness greater than a thickness of the first portion of the upper insulation layer.

3. The semiconductor device of claim 1, wherein the first and second portions are connected to each other.

4. The semiconductor device of claim 1, wherein a top surface of the first portion is substantially leveled with a top surface of the second portion.

5. The semiconductor device of claim 1, wherein a thickness of the second portion of the upper insulation layer is greater than a sum of a thickness of the capping insulation layer and a thickness of the first portion of the upper insulation layer.

6. The semiconductor device of claim 1, wherein the top surface of the capping insulation layer is positioned between those of top and bottom surfaces of the conductive mask pattern.

7. The semiconductor device of claim 1, wherein the lower insulation layer and the second portion are at least partially overlapped with each other in a horizontal direction.

8. The semiconductor device of claim 1, wherein a thickness of the second portion is greater than a sum of a thickness of the lower insulation layer and a thickness of the capping insulation layer.

9. The semiconductor device of claim 1, wherein a bottom surface of the lower insulation layer is substantially leveled with the bottom surface of the second portion.

10. The semiconductor device of claim 1, wherein the lower insulation layer extends between the second portion and the substrate.

11. The semiconductor device of claim 10, wherein a thickness of the lower insulation layer between the second portion and the substrate is less than that of the lower insulation layer between the capping insulation layer and the substrate.

12. The semiconductor device of claim 1, wherein the lower insulation layer does not extend onto the peripheral region.

13. The semiconductor device of claim 1, wherein the upper insulation layer includes a low-k dielectric material.

14. A semiconductor device, comprising:
a substrate including a cell region and a peripheral region;
a pair of magnetic tunnel junction patterns on the cell region;
a pair of conductive mask patterns respectively on the pair of magnetic tunnel junction patterns;
a capping insulation layer between the pair of magnetic tunnel junction patterns;
a lower insulation layer between the capping insulation layer and the substrate; and
an upper insulation layer including a first portion on the capping insulation layer,
wherein a top edge of the capping insulation layer is in direct contact with a point on a sidewall of each of the pair of conductive mask patterns, the point being between top and bottom surfaces of each of the pair of conductive mask patterns,
wherein the lower insulation layer has a top surface including a recess portion in contact with the capping insulation layer,
wherein the bottom surface of the capping insulation layer is disposed lower than a bottom surface of the pair of magnetic tunnel junction patterns, and
wherein an entire top surface of the capping insulation layer is substantially flat.

15. The semiconductor device of claim 14, wherein the first portion covers the pair of conductive mask patterns.

16. The semiconductor device of claim 14, wherein the pair of magnetic tunnel junction patterns comprises a first magnetic tunnel junction pattern and a second magnetic tunnel junction pattern, and
wherein the bottom surface of the capping insulation layer extends from the first magnetic tunnel junction pattern to the second magnetic tunnel junction pattern and convexly protrudes toward the substrate between the pair of magnetic tunnel junction patterns.

17. The semiconductor device of claim 14, wherein the capping insulation layer fills a gap between the pair of magnetic tunnel junction patterns.

18. The semiconductor device of claim 14, wherein the capping insulation layer completely fills the recess portion below the pair of magnetic tunnel junction patterns.

* * * * *